US 7,295,575 B2

(12) United States Patent
Ido et al.

(10) Patent No.: US 7,295,575 B2
(45) Date of Patent: Nov. 13, 2007

(54) PACKET TRANSMITTING/RECEIVING APPARATUS AND PACKET TRANSMISSION METHOD

(75) Inventors: Daiji Ido, Yokohama (JP); Koji Imura, Machida (JP); Akihiro Miyazaki, Sakai (JP); Koichi Hata, Katano (JP); Carsten Burmeister, Darmstadt (DE)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1046 days.

(21) Appl. No.: 10/173,308

(22) Filed: Jun. 18, 2002

(65) Prior Publication Data
US 2002/0191614 A1   Dec. 19, 2002

(30) Foreign Application Priority Data
Jun. 19, 2001   (JP) ............................. 2001-184794

(51) Int. Cl.
  *H04J 3/24*   (2006.01)
(52) U.S. Cl. .................. 370/474; 370/349; 370/394; 370/410; 370/477; 370/392
(58) Field of Classification Search .................... None
  See application file for complete search history.

(56) References Cited

U.S. PATENT DOCUMENTS 6,608,841 B1 * 8/2003 Koodli ................. 370/474
6,832,378 B1 * 12/2004 Beatty et al. ............. 718/104
6,963,570 B1 * 11/2005 Agarwal ................ 370/395.32

FOREIGN PATENT DOCUMENTS

WO   0060795   10/2000

OTHER PUBLICATIONS

S. Casner et al., "Compressing IP/UDP/RTP headers for Low-Speed Serial Links", RFC2508, Network Working Group, Internet RFC/STD/FYI/BCP Archives, Feb. 1999.
C. Bormann, et al., "Robust Header Compression (ROHC): Framework and Four Profiles: RTP, UDP, ESP, and Uncompressed", Network Working Group, Internet RFC/STD/FYI/BCP Archives, Jul. 2001.
C. Perkins, et al., "Effects of interleaving on RTP header compression", INFOCOM 2000, Nineteenth Annual Joint Conference of the IEEE Computer and Communications Societies, Proceedings, IEEE Tel Aviv, Israel. Mar. 26-30, 2000, Piscataway, NJ, USA, IEEE, US Mar. 26, 2000 pp. 111-117, XP010376011.
C. Bormann, et al., RObust Header Compression (ROHC), Internet Draft, Nov. 24, 2000, pp. 1-156, XP002211014.

* cited by examiner

Primary Examiner—Raj K Jain
(74) Attorney, Agent, or Firm—Stevens, Davis, Miller & Mosher, LLP (57) ABSTRACT

A packet transmission apparatus and method may divide data into a plurality of packets and transmit the packets. At a transmitting end, a context identifying number, identifying a data stream, is selected based on a relationship between a sequence number of a packet that is to be transmitted and a sequence number in an immediately preceding packet. A sequence number denoting an order of a packet divided on a per context basis is compressed, and transmission data assigned to the context identifying number with the compressed sequence number is transmitted on a per packet basis. At the receiving end, the compressed sequence number is decompressed on a per context basis. The context is separated based on the context identifying number, and data is combined by reassembling a packet into the order of a decompressed sequence number.

5 Claims, 10 Drawing Sheets

FIG.1A  UNCOMPRESSED PACKET (IR)

FIG.1B  COMPRESSED PACKET (IR)

| MEDIA TYPE | | VIDEO | AUDIO |
|---|---|---|---|
| CID | | 2 | 5 |
| STATIC INFORMATION | TRANSMISSION SOURCE IP ADDRESS | 133.0.0.1 | 133.0.1.127 |
| | DESTINATION IP ADDRESS | 134.100.100.100 | 134.100.100.100 |
| | TRANSMISSION SOURCE PORT ADDRESS | 56 | 60 |
| | TRANSMISSION DESTINATION PORT NUMBER | 120 | 122 |
| DYNAMIC INFORMATION | SN | 1,2,3,4,... | 64,65,66,67,... |

| 0 | 1 | 2 | 3 | 4 | 5 | 6 | 7 |
|---|---|---|---|---|---|---|---|
| 1 | 1 | 1 | 0 | \multicolumn{4}{c|}{CID} |
| \multicolumn{8}{|c|}{(UN) COMPRESSED PACKET} |
| \multicolumn{8}{|c|}{} |

FIG.3B

| 0 | 1 | 2 | 3 | 4 | 5 | 6 | 7 |
|---|---|---|---|---|---|---|---|
| 1 | 1 | 1 | 0 | 0 | 1 | 0 | 1 |
| \multicolumn{8}{|c|}{(UN) COMPRESSED PACKET} |
| \multicolumn{8}{|c|}{} |

PACKET TRANSMITTING/RECEIVING APPARATUS AND PACKET TRANSMISSION METHOD

BACKGROUND OF THE INVENTION

1. Field of the Invention

The present invention relates to a packet transmitting/receiving apparatus and packet transmission method, and more particularly to a packet transmitting/receiving apparatus and packet transmission method that are suitable for use in wireless communication.

2. Description of the Related Art

Among the most common protocols (communication rules) presently used to transmit packets on the Internet are the RTP (Real-time Transport Protocol), UDP (User Data Protocol), and IP (Internet Protocol). In packet transmission, these protocols are commonly used in combination, and besides, these protocols have been standardized by the IETF (Internet Engineering Task Force).

In each of the above protocols, information is appended as described below to transmission data for a header to form a packet. That is, by RTP, a sequence number (hereinafter "SN" when necessary), which denotes the data order, and a time stamp (hereinafter "TS" when necessary), which is the time information, are appended to data to form an RTP packet.

Next, by UDP, the port number of the receiving end is appended to an RTP packet to form a UDP packet. Furthermore, by IP, the Internet address (IP address) of the receiving end is appended to a UDP packet to form an IP packet, which then will be transmitted to the receiving end.

Of these headers appended thus by RTP, UDP, and IP, the TS and SN vary every time a packet is transmitted and therefore are dynamic information, whereas the rest of information is static information (STATIC information) that becomes invariant once transmission begins.

A header like this is given by each protocol, and so when several protocols are used in communication, the header portion becomes long and the packet transmission rate decreases. For this reason, there are header compression methods that compress the header and then transmit a packet to improve the packet transmission rate.

The compression method for each header appended by RTP, UDP, and IP is prescribed by the IETF in RFC (Request for Comments) 2508. The header compression methods prescribed in RFC2508 are principally for packet transmission over wired networks such as the Internet.

In contrast to this, one header compression method presently proposed by the IETF for wireless packet transmission such as used in a cellular phone network is the ROHC (RObust Header Compression). This header compression method, noting that the rate of error occurrence tends to be higher in a wireless network than in a wired network, features a high error resiliency for the errors that occur during transmission.

Also, because the band frequency that a wireless network can make use of is narrower than that of a wired network, ROHC sets a higher header compression ratio than the compression methods prescribed in RFC2508. Incidentally, the ROHC is standardized under RFC 3095.

Figure 1A:
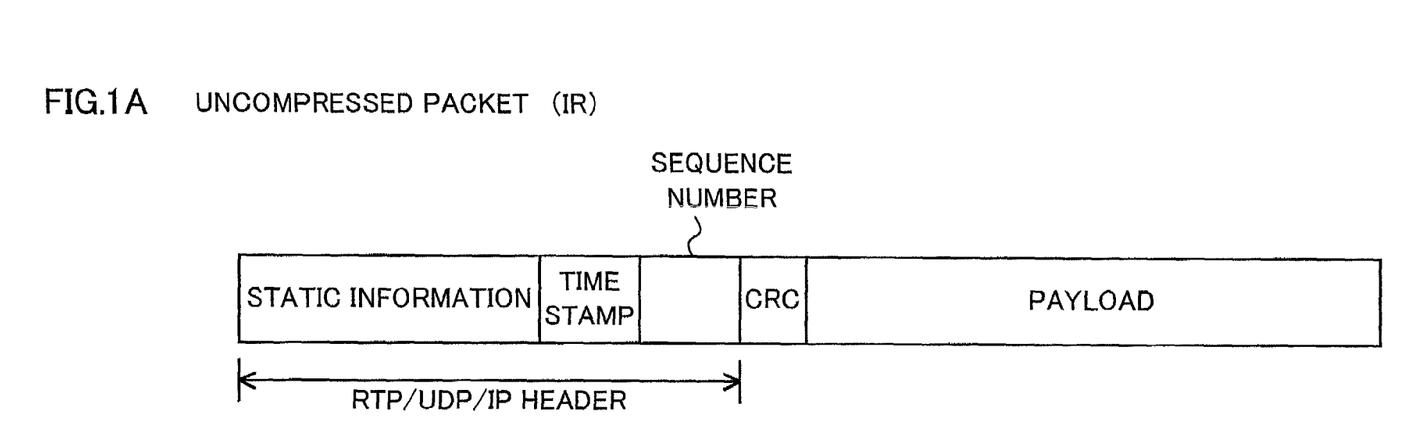
FIG. 1A is frame diagrams showing sample configurations of packets.
Figure 1B:
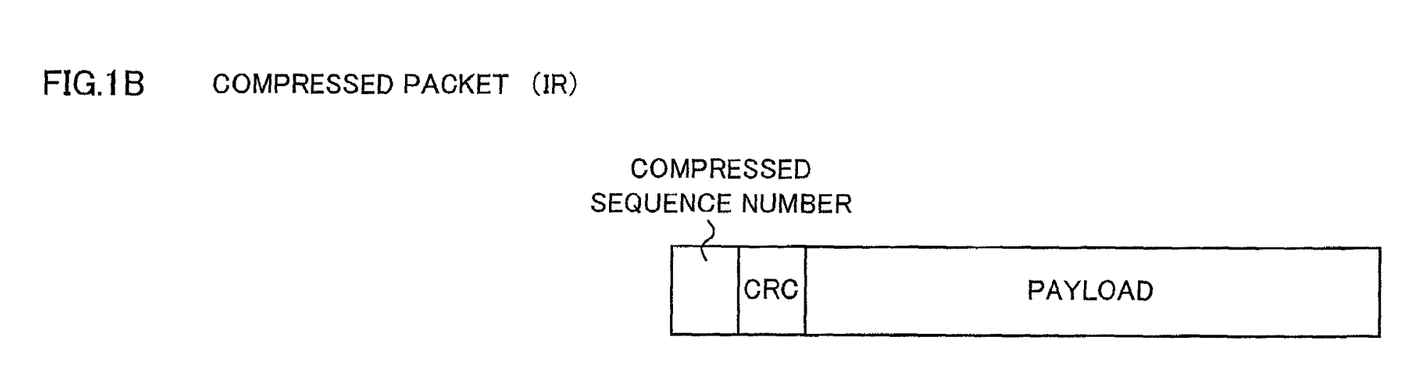
FIG. 1B is frame diagrams showing sample configurations of packets.

In the ROHC, there are two types of headers as shown in FIG. 1A and FIG. 1B, each respectively refereed to as the uncompressed (IR) packet and compressed (SO) packet. The header of an IR packet shown in FIG. 1A contains the parameters that do not vary in the course of communication (IP addresses, port numbers, etc.: static information), parameters that do vary in the course of communication (SN, TN, etc.), and CRC (Cyclic Redundancy Examine) bits that examine as to whether the header, when decompressed on the receiving end, has been correctly decompressed.

These static information, TS, and SN are often transmitted at predetermined intervals. The compressed packet shown in FIG. 1B does not contain an IP address, port number, TS, or ΔTS (TS increase), but does contain a compressed sequence number (hereinafter "SN'" when necessary) and CRC bits. The SN' is manifested with the lower several bits of the original 16-bit SN.

To be specific, ROHC compresses a header as follows. That is, an uncompressed header containing an IP address and a port number is transmitted not by every transmission unit, but at predetermined intervals. If a consistent pattern appears between the SN increase and TN increase, the SN alone will be transmitted, and the TS increase will be calculated from the SN increase on the receiving end.

With respect to the SN, furthermore, only several lower bits are transmitted in an SO packet, and only when a carry occurs will the complete bits of an SN be transmitted. In this case, the transmitting end compresses a header with reference to referential information called the context, whereas the receiving end decompresses the header by using the same context as the one used by the transmitting end. The referential information here refers to previously transmitted header information.

When an uncompressed packet or a compressed packet described herein is transmitted, a CID (Context Identifier) that identifies the type of data is appended to the top of a packet.

A packet is transmitted with a CID thus appended thereto, and the receiving end makes reference to this CID appended to the packet at the transmitting end and identifies the packets with the same CID to be the packets of the same media type, thus distinguishing packets by the media type, and transmit the data of a plurality of media types by using one channel.

For instance, when two media types of data are transmitted using one channel, the voice data and image data each have separate contexts and are appended a different CID on a per data stream basis and transmitted.

Figure 2:
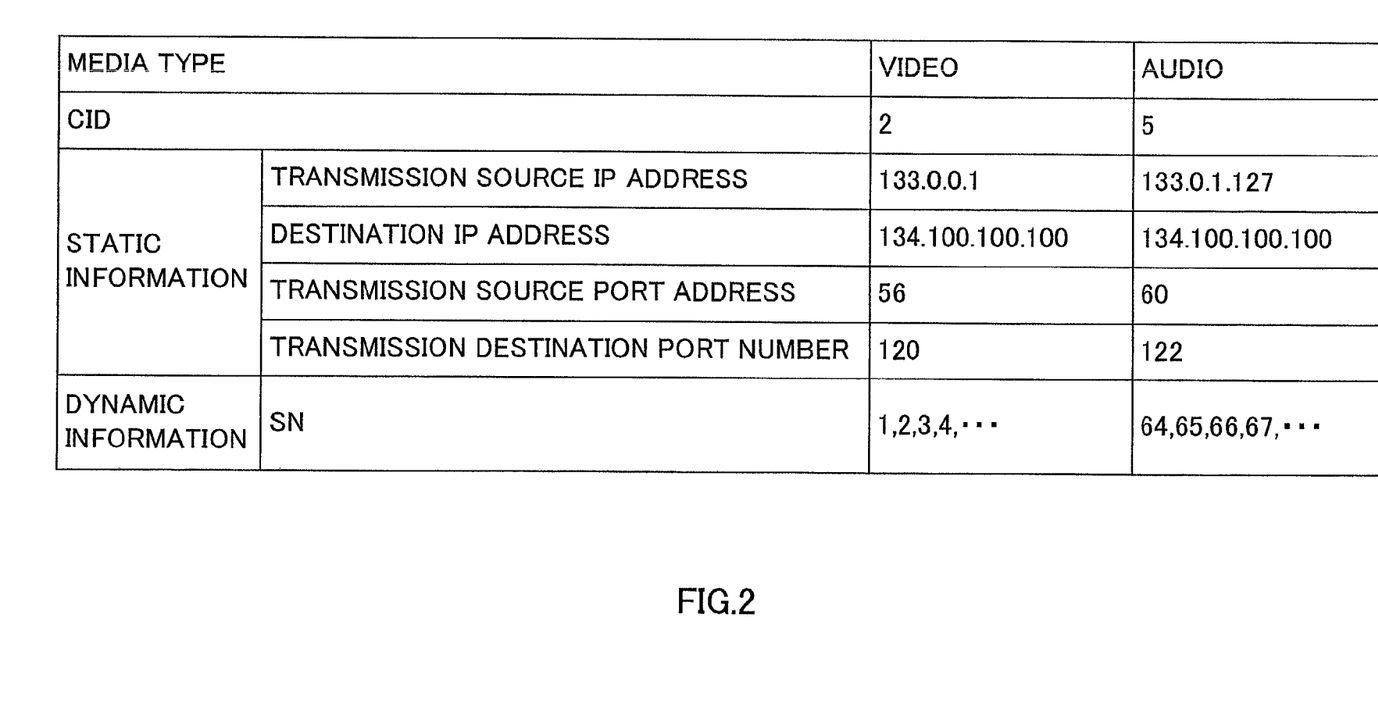
FIG. 2 is a diagram showing sample CIDs.

FIG. 2 is a drawing showing a sample CID. In FIG. 2, each RTP packet to be transmitted has separate context for each media type such as video and audio. In other words, the static information and dynamic information used upon sending data differ between the video data and the audio data.

Static information herein refers to the information that does not vary when certain data is sent, and specific examples are the transmission source IP address, destination IP address, transmission source port number, transmission destination port number, and so on. On the other hand, the dynamic information here refers to information that varies on a per packet basis when certain data is sent, and specific examples are the SNs in packets and so on.

FIG. 2 shows a case where the data of two different media types, video and audio, are transmitted from varying IP addresses to one same IP address. Here the transmission source IP address for the video data is "133.0.0.1," while the transmission source IP address for the audio data is "133.0.1.127." The transmission source IP addresses thus vary. However, the destination IP address is "133.100.100.100" for both video and audio data.

The transmission source port numbers vary, with "56" for the video data and "60" for the audio data. Also, the transmission destination port numbers vary, with "120" for the video data and "122" for the audio data.

The video data and the audio data are each divided into a plurality of packets and transmitted, and an SN is appended to each packet to denote the order of packets. Furthermore with respect to the SN, a different number is assigned per CID.

For instance, for the video data with a CID="2," SN="1," "2," "3," "4," . . . is applied, and for the audio data with a CID="5," SN="64," "65," "66," "67," . . . is applied.

Figure 3A:
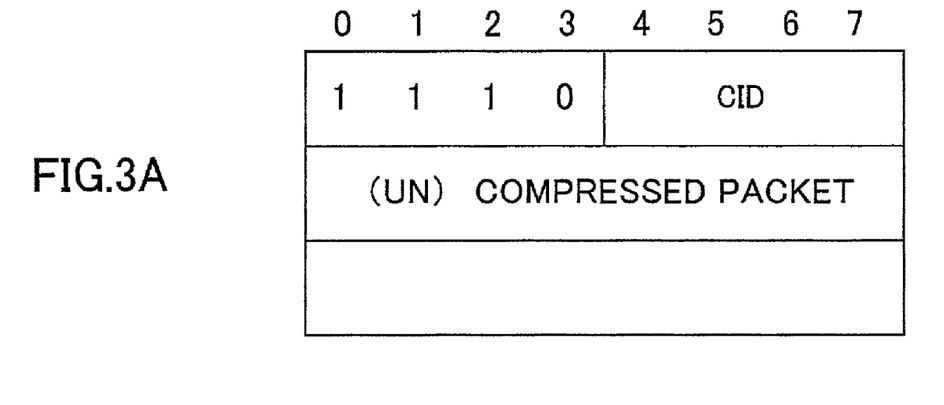
FIG. 3A is frame diagrams showing sample configurations of a packet.
Figure 3B:
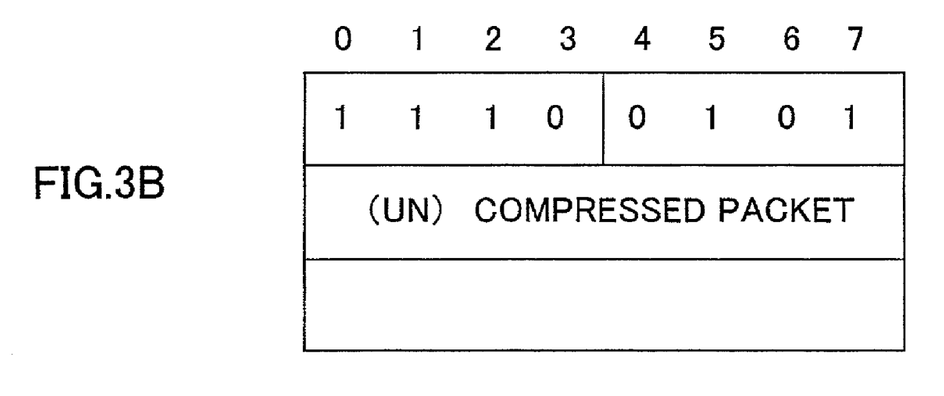
FIG. 3B is frame diagrams showing sample configurations of a packet.

A case where a fixed CID is appended to a packet will be described. FIG. 3A and FIG. 3B is a pattern diagram showing the configurations of a packet. FIG. 3 shows the content in each bit per packet byte in the horizontal direction, and packets on a per byte basis in the vertical direction.

Regardless of a compressed packet or an uncompressed packet, one-byte header that contains a CID is appended to the top of a packet. FIG. 3A is a sample configuration in which a 4-bit CID is contained in a one-byte header. In FIG. 3B, the lower bits in the one-byte header become the CID field that stores a CID. For example, when a CID is "5," "0101," which is a binary form of "5," is accommodated in the CID field. FIG. 3B shows a case of a packet with a CID="5." A packet is accommodated after the second byte. A packet to be accommodated may be either a compressed packet or an uncompressed packet.

Figure 4A:
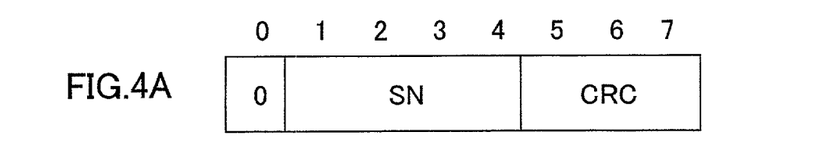
FIG. 4A is frame diagrams showing the configurations of headers in a compressed packet.
Figure 4B:
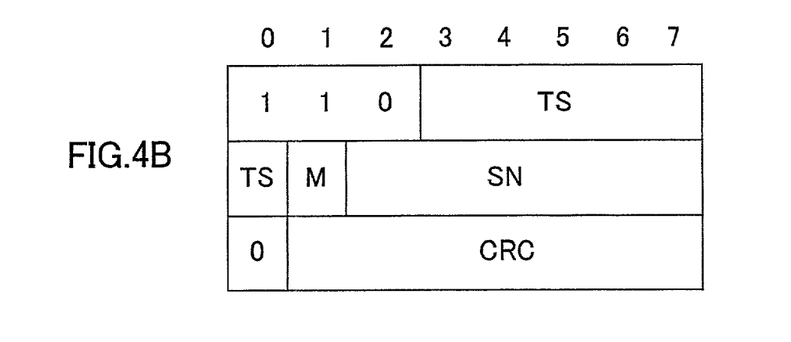
FIG. 4B is frame diagrams showing the configurations of headers in a compressed packet.
Figure 4C:
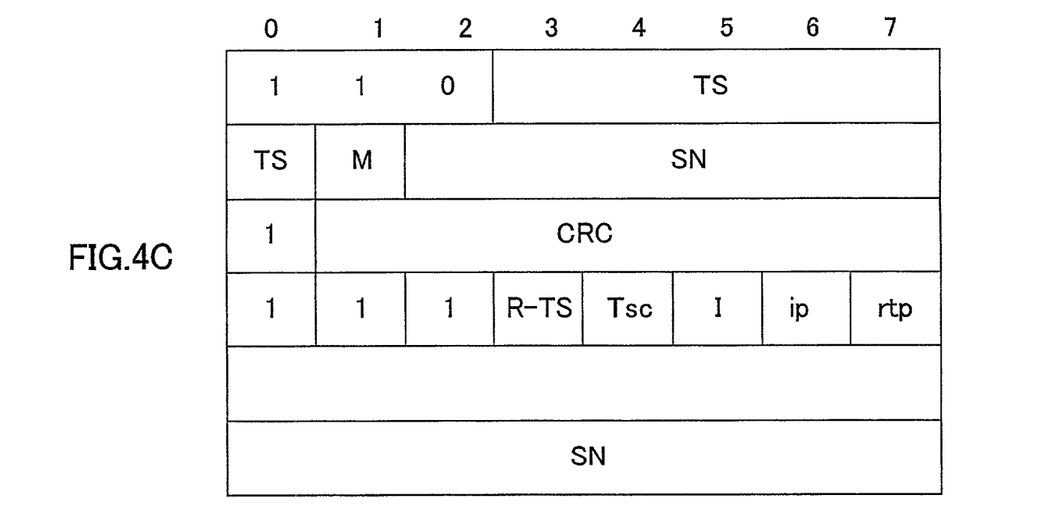
FIG. 4C is frame diagrams showing the configurations of headers in a compressed packet.

Next, tile configuration of a compressed packet will be described. FIG. 4A, FIG. 4B, and FIG. 4C show the content in each bit per packet byte in the horizontal direction, and packets on a per byte basis in the vertical direction.

FIG. 4A is a pattern diagram showing a sample configuration of the UOR-0 packet. In FIG. 4A, a "0" is accommodated in the 0 bit of the 1st byte, an "SN" in the 1st through 4th bit, and a CRC in the 5th through 7th bit.

FIG. 4B is a pattern diagram showing a sample configuration of the UOR-2 packet. In FIG. 4B, "110" is accommodated in the 0 through 2nd bit of the 1st byte, a TS in the 3rd bit of the 1st byte through the 0 bit of the 2nd byte, an M in the 2nd bit of the 2nd byte, an SN in the 2nd through 7th bit of the 2nd byte, "0" in the 0 bit of the 3rd byte, and a CRC in the 1st through 7th bit of the 3rd byte.

FIG. 4C is a pattern diagram showing a sample configuration of an extended UOR-2 packet. In FIG. 4C, "110" is accommodated in the 0 through 2nd bit of the 1st byte, a TS in the 3rd bit of the 1st byte through the 0 bit of the 2nd byte, an M in the 2nd bit of the 2nd byte, an SN in the second through the 7th bit of the 2nd byte, "1" in the 0 bit of the 3rd byte, and a CRC in the 1st through 7th bit of the 3rd byte.

As shown in FIG. 4, with compressed packets, the SN size varies on the basis of the packet format, and the field for an expressible SN also varies. So, in the packet format where an expressible SN is minimal, only an SN', and not an SN, is transmitted.

Figure 5:
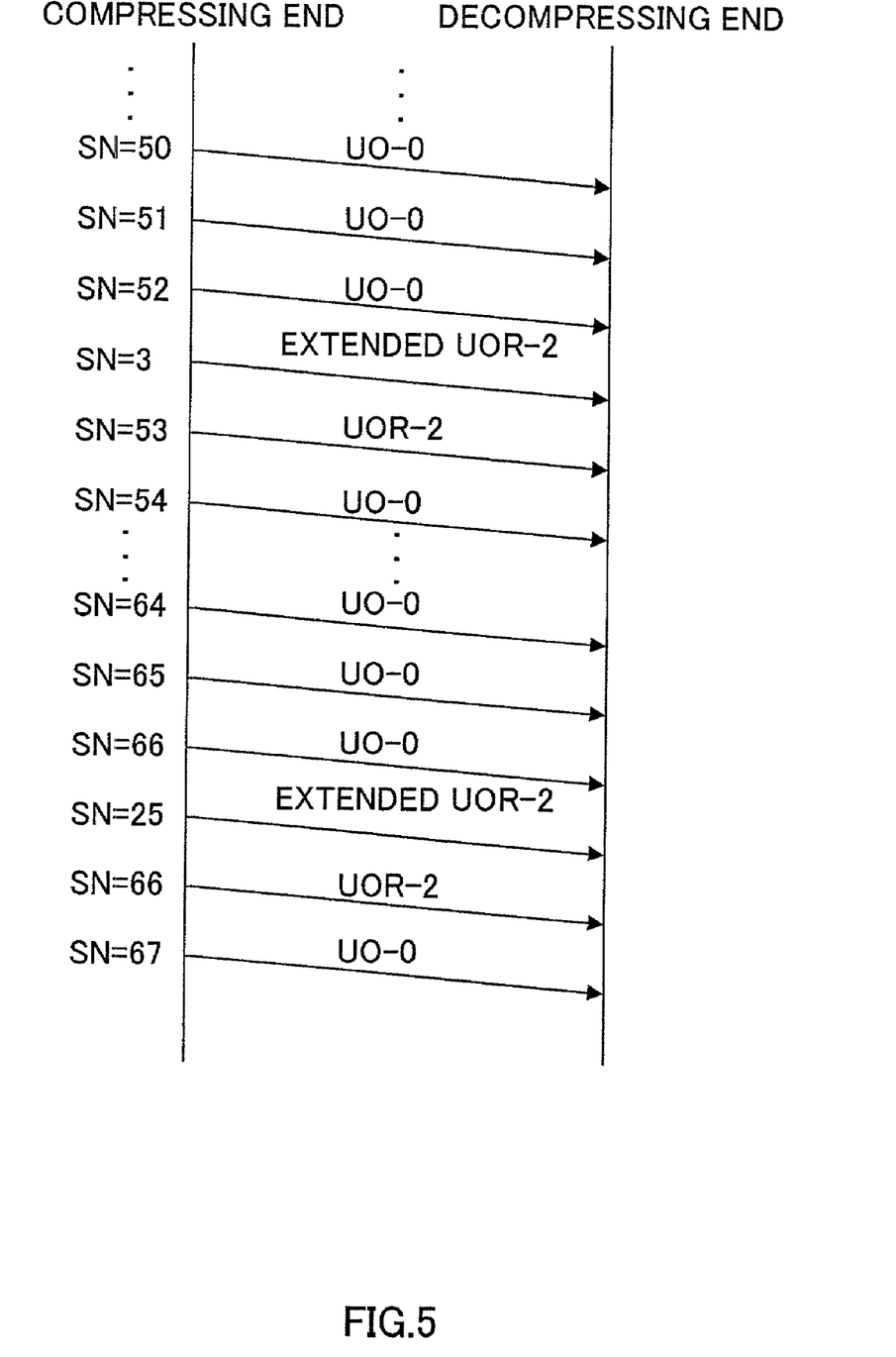
FIG. 5 is a sequence diagram showing an example of the exchange in communication using compressed packets.

Next, communication using compressed packets will be described. FIG. 5 is a sequence diagram showing the exchange in compressed-packet communication.

With reference to FIG. 5, the exchange between the compressing end that compresses and transmit packets and the decompressing end that receives and decompresses packets will be described.

When a packet with an SN=50 is transmitted first and a packet with an SN=51 is transmitted next, the latter packet is transmitted with an SN greater by 1 than the SN in an immediately preceding packet and can be compressed using UO-0 with the SN size of 4 bits.

Similarly, when a packet with an SN=51 is transmitted first and a packet with an SN=52 is transmitted next, the latter packet is transmitted with an SN greater by 1 than the SN in an immediately preceding packet and can be compressed using UO-0 with the SN size of 4 bits.

Next, when a packet with an SN=52 is transmitted first and a packet with an SN=3 is transmitted next, the latter packet is transmitted with an SN smaller by 49 than the SN in an immediately preceding packet, and the change in the SN can not be expressed using UO-0 with the SN size of 4 bits. So, extended UO-0 is used for compression and transmission.

Next, when a packet with an SN=3 is transmitted first and a packet with an SN=53 is transmitted next, the latter packet is transmitted with an SN greater by 50 than the SN in an immediately preceding packet, and the change in the SN can not be expressed using UO-0 with the SN size of 4 bits. So, extended UO-0 with the SN size of 4 bits is used for compression and transmission.

Thus the header size is reduced by selecting a header compression format capable of expressing a range of SN changes.

Here the SN ranges that UOR-0, UOR-2, and extended UOR-3 are capable of expressing will be described.

To compress a packet with an SN=v (V is an optional whole number), the ROHC prescribes that v be within the range of function f in equation (1).

$$f(v\_ref, k) = [v\_ref - p, v\_ref + (2^k - 1) - p] \quad (1)$$

V_ref here refers to the SN in an immediately preceding packet. When the SN is less than 4, p becomes 1, and when the SN is greater than 4, p is expressed as $2^{bits(SN)} - 1$, with bits(SN) denoting the bit number that expresses the SN.

Thus with UO-0, an SN is expressed using 4 bits, and v needs to be within the range of equation (2).

$$f(v\_ref, 4) = [v\_ref - 1, v\_ref + 14] \quad (2)$$

With UO-2, an SN is expressed using 6 bits, and v needs to be within the range of equation (3).

$$f(v\_ref, 6) = [v\_ref - 1, v\_ref + 62] \quad (3)$$

With extended UO-2, an SN is expressed using 14 bits, and v needs to be within the range of equation (4).

$$f(v\_ref, 14) = [v\_ref - 511, v\_ref + (2^{14} - 1) - 511] \quad (4)$$

However, with a conventional apparatus, when the order of packets varies and the SN value decreases, instead of increasing on a constant basis, or increases by a large value, transmission is performed using a packet format with a large range that an SN can express. As a result, data is transmitted in a packet format that requires a large field for an SN, and the compression efficiency decreases.

SUMMARY OF THE INVENTION

An object of the present invention is to provide a packet transmitting/receiving apparatus and packet transmission method that make data transmission with high compression efficiency possible.

In packet communication in which data is divided into a plurality of packets and then transmitted, the above object can be achieved by assigning sequence numbers at the transmitting end that denote the order of divided packets to a plurality of contexts within a compressible range, and then compressing and transmitting the sequence numbers on a per context basis, and by decompressing the compressed sequence numbers on a per context basis at the receiving end.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

The preferred embodiments of the present invention will be described below with reference to the attached drawings.

Embodiment 1

Figure 6:
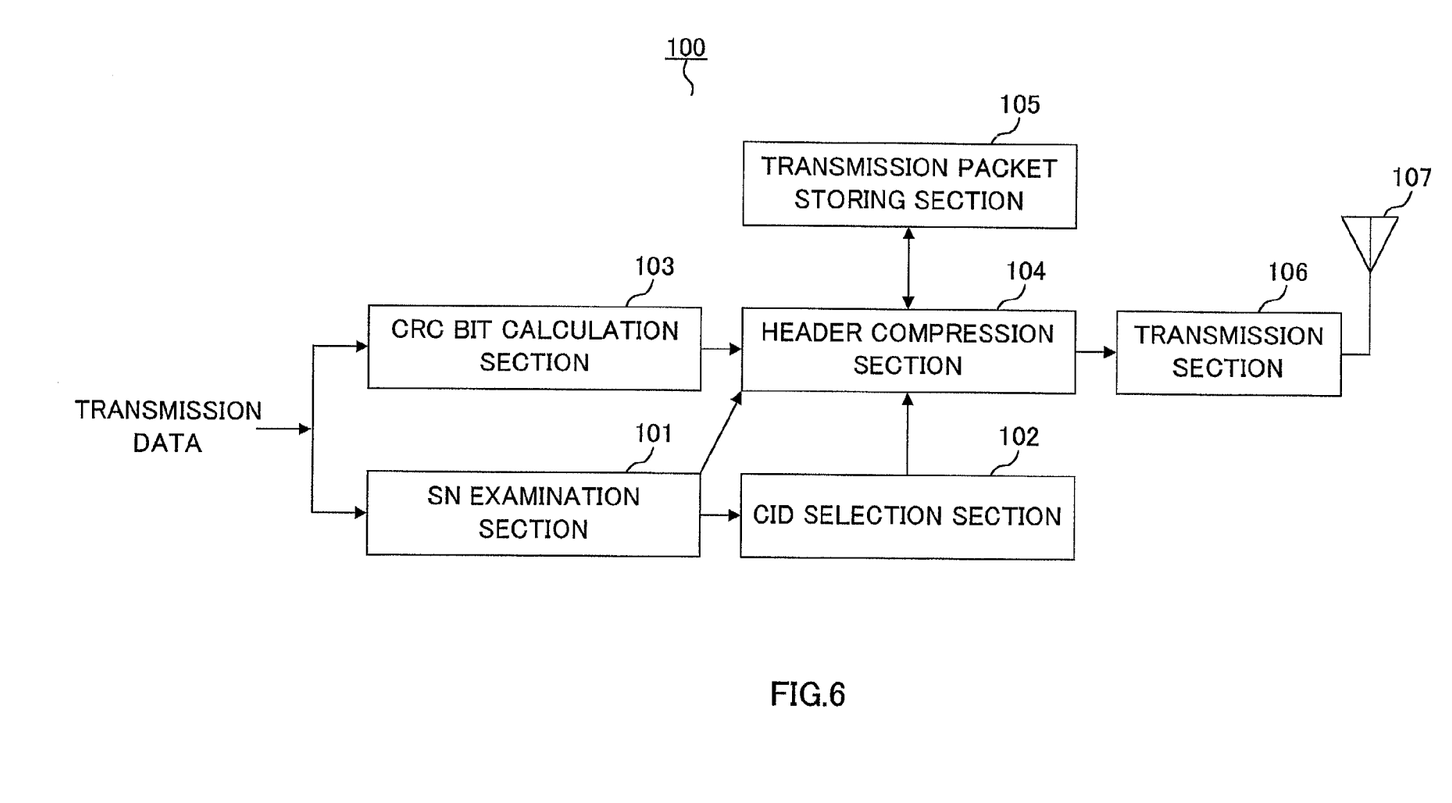
FIG. 6 is a block diagram showing the configuration of a packet transmitting/receiving apparatus according to Embodiment 1 of the present invention.

The transmitting end will be described first. FIG. 6 is a block diagram showing the configuration of a packet transmitting/receiving apparatus according to an embodiment of the present invention.

In FIG. 6, packet transmitting/receiving apparatus 100 consists chiefly of SN examination section 101, CID selection section 102, CRC bit calculating section 103, header compression section 104, transmission packet storing section 105, transmission section 106, and antenna 107.

SN examination section 101 monitors transmission data on a per packet basis and compares the SN in a packet to be transmitted with the SN in an immediately preceding packet, and outputs the comparison result and with transmission data (packet) to CID selection section 102.

CID selection section 102 selects a CID based on the comparison result output from SN examination section 101, appends the CID to the transmission data, and outputs the data to header compression section 104. To be more specific, CID selection section 102 selects a plurality of CIDs for a data stream (media) and, when the SN change volume between a packet to be transmitted and a packet transmitted immediately prior thereto cannot be expressed using a compressed packet, selects a CID that varies from the CID of an immediately preceding packet.

For instance, CID=2 and CID=5 are used with respect to image data, and CID=3 and CID=6 are selected and appended to transmission data with respect to voice data. The appended CIDs will be described later.

Also, CID selection section 102 outputs the information on the CIDs assigned to one data stream to transmitting section 106 via header compression section 104 and to the other communication end. The timing to transmit the CID information is not particularly fixed, and the information may be transmitted immediately before the data is transmitted or may be transmitted when one data stream uses a plurality of CIDs.

CRC bit calculating section 103 calculates a CRC bit from the header information contained in the transmission data and outputs the CRC bit to header compression section 104.

Header compression section 104 determines on a header compression format based on the comparison result output from SN examination section 101 and the packet in information stored in transmission packet storing section 105 that will be described later, compresses a header that contains an SN and a CRC bit, and connects the header with transmission data and outputs the header to transmission section 106. Header compression section 104 outputs a packet that is to be transmitted to transmission packet storing section 105.

Transmission packet storing section 105 stores a transmitted packet, and more specifically, transmission packet storing section 105 stores an immediately preceding transmitted packet.

Transmission section 106 performs on a packet the D/A conversion, coding, modulation, and modulation-modification into a radio modulation, and transmits the packet via antenna 107. Antenna 107 transmits a signal output from transmission section 105 as a radio signal.

Figure 7:
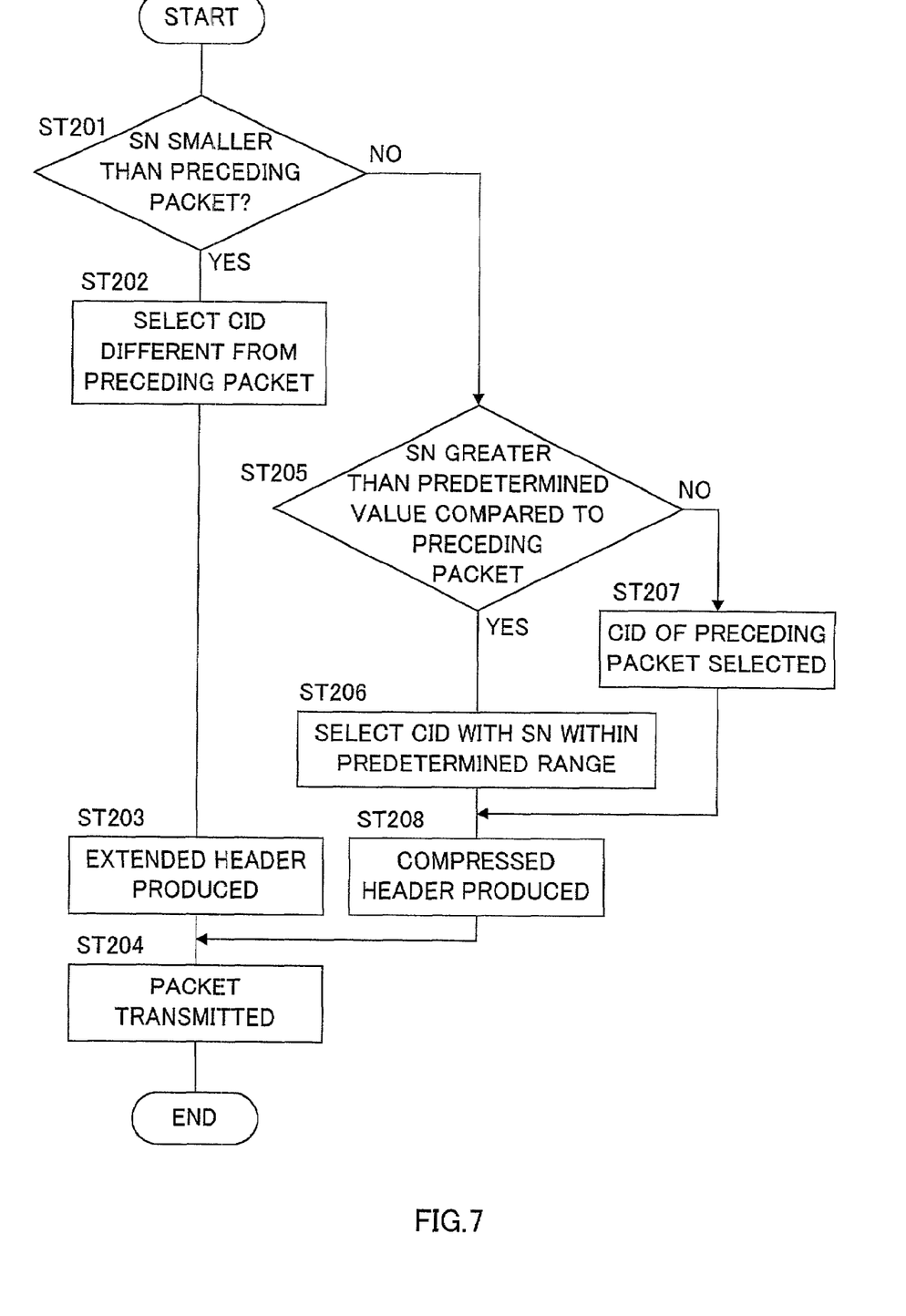
FIG. 7 is a flow-chart showing an example of the operation of the packet transmitting/receiving apparatus according to the above embodiment.

Next the operation of packet transmitting/receiving apparatus 100 according to the present embodiment will be described. FIG. 7 is a flow-chart showing a sample operation of the packet transmitting/receiving apparatus according to the present embodiment.

In step (hereinafter "ST") 201, SN examination section 101 makes a judgment as to whether the SN in a packet to be transmitted is less than the SN in an immediately preceding packet.

When the SN in a packet to be transmitted is less than the SN in an immediately preceding packet, the step proceeds to ST 202. When the SN in a packet to be transmitted is greater than the SN in an immediately preceding packet, the step proceeds to ST 205.

In ST 202, CID selection section 102 selects a CID that varies from that of an immediately preceding packet. In ST 203, header compression section 104 produces an extended header, and for example produces a packet in an extended UOR-2 format. In ST 204, transmission section 106 converts a packet into a radio signal and transmits the signal.

In ST 205, SN examination section 101 makes a judgment as to whether the result of subtracting from the SN in a packet that is to be transmitted the SN in an immediately preceding packet is greater than a predetermined value. The predetermined value here denotes an SN range that can be expressed using the compressed header. When the result of subtracting the SN in an immediately preceding packet from a packet that is to be transmitted is less than a predetermined value, the step proceeds to ST 207.

In ST 206, CID selection section 102 makes reference to the packets transmitted earlier and selects a CID that is the same as that of a packet with an SN value within the range of a predetermined value of the SN in a packet that is to be transmitted, and the step proceeds to ST 208. The predetermined value here indicates the SN range that the compressed header can express.

In ST 207, CID selection section 102 selects a CID that is the same as that of an immediately preceding packet. In ST 208, header compression section 104 produces a compressed header, and for example produces a packet in the UOR-0 format, and the step proceeds to ST 204.

Figure 8:
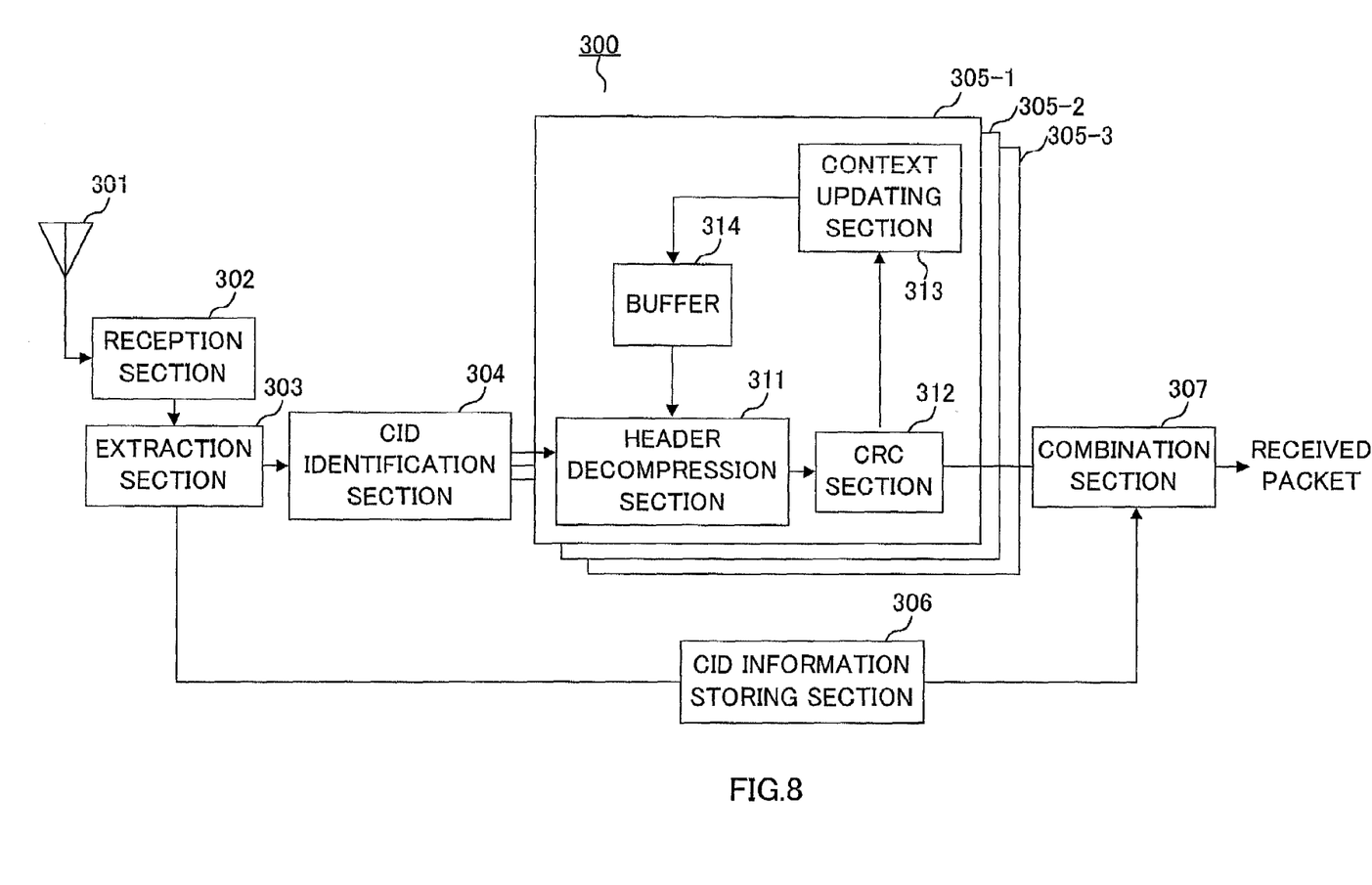
FIG. 8 is a block diagram showing the configuration of a packet transmitting/receiving apparatus according to an embodiment of the present invention.

The receiving end will be described next. FIG. 8 is a block diagram showing the configuration of a packet transmitting/receiving apparatus according to an embodiment of the present invention.

Packet transmitting/receiving apparatus 300 in FIG. 8 consists chiefly of antenna 301, receiving section 302, extracting section 303, CID identifying section 304, decompression sections 305-1~305-3, CID information storing section 306, and combining section 307.

Antenna 301 receives a radio signal and outputs the signal to receiving section 302. Receiving section 302 performs the frequency modification, demodulation, decoding processing, and A/D conversion on the signal received via antenna 301, and outputs the received packet thus obtained to extracting section 303.

From the received packet extracting section 303 extracts the information on a plurality of CIDs assigned per data stream and outputs the information to CID information storing section 306.

CID identifying section 304 extracts the CID from the received packet and outputs the CID with the received packet to decompression sections 305-1~305-3.

Decompression sections 305-1~305-3, each operating independently on a per CID basis, decompress the SN in a received packet. Decompression sections 305-1~305-3 reassemble the packets into the order of decompressed SNs, and outputs the packets to combining section 307.

CID information storing section 306 combines and stores the CID information used in the same data stream, and outputs the information on the combinations of the stored CIDs to combining section 307.

Combining section 307 reassembles the received packets into the SN order, using the packets that have a plurality of CIDs used with respect to the same data stream, and thus recovers the received data.

The inner configuration of recovering sections 305-1~305-3 will be described below. Recovering sections 305-1~305-3 each consist chiefly of header decompression section 311, CRC section 312, context updating section 313, and buffer 314.

Header decompression section 311 makes reference to the referential information (context information) stored in buffer 314 that will be described later and decompresses the header of a received packet. Header decompression section 311 performs SN decompression independently per CID that is output from CID identifying section 304, and thus decompresses the header. A packet with a decompressed SN can be reassembled into the original order regardless of the CID.

CRC section 312 performs error detection and error correction using the CRC contained in a received packet. When no error is detected with a received packet, CRC section 312 outputs the header information of the received packet to context updating section 313, and requests to update the context information. When no error is detected with a received packet, CRC section 312 outputs the packet to combining section 307 with the header information.

Context updating section 313, when requested a context update from CRC section 312, outputs to buffer 314 the header information output from CRC section 312, and update the context that is to be stored in buffer 314.

Buffer 314 stores the header information output from context updating section 313. Buffer 314 also updates and stores the context, which is stored reactively to the request for context from context updating section 313, using the header information output from context updating section 313.

Figure 9:
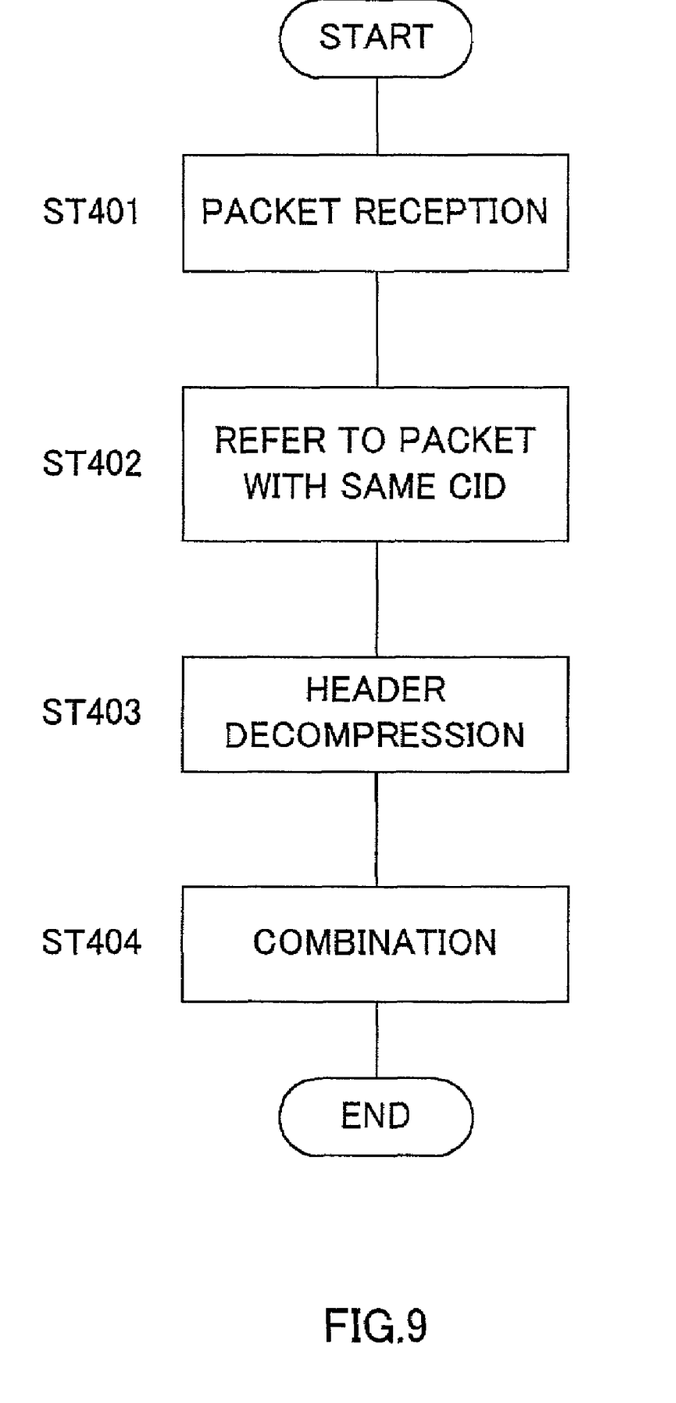
FIG. 9 is a flow-chart showing an example of the operation of the packet transmitting/receiving apparatus according to the above embodiment.

The operation of packet transmitting/receiving apparatus 300 according to the present embodiment will be described next. FIG. 9 is a flow-chart showing a sample operation of the packet transmitting/receiving apparatus according to the present embodiment.

In step 401, receiving section 302 receives radio signals transmitted on a per packet basis. In ST 402, CID identifying section 304 makes a judgment as to whether the CID of a received packet is the same as the CID of an immediately preceding packet. When the CID of a received packet differs from the CID of an immediately preceding packet, the step proceeds to ST 402. When the CID of a received packet is the same as the CID of an immediately preceding packet, the step proceeds to ST 403.

In ST 402, header decompression section 311 makes reference to a packet that shares the same CID with a received packet, and calculates an SN. In ST 403, header decompression section 311 decompresses the header.

In ST 404, combining section 307 reassembles the received packets that have a plurality of CIDs used with respect to the same data stream into the SN order and thus recovers the received data.

Figure 10:
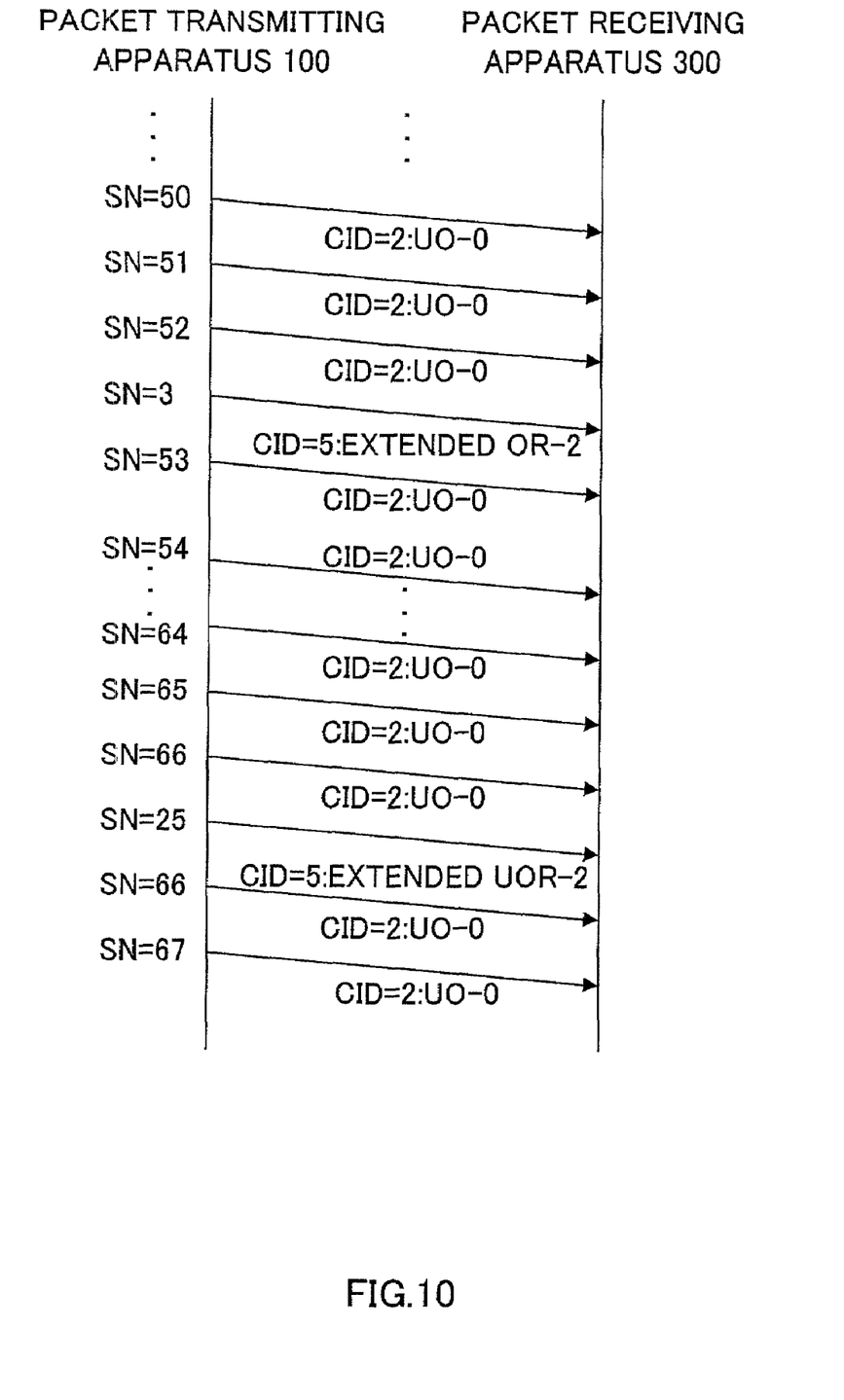
FIG. 10 is a sequence diagram showing an example of the exchange in communication using the packet transmitting/receiving apparatus according to the above embodiment.

The exchange in communication using the packet transmitting/receiving apparatus according to the present embodiment will be described. FIG. 10 is a sequence diagram showing the exchange in communication in the packet transmitting/receiving apparatus according to the present invention.

With FIG. 10, a case where packets are transmitted from packet transmitting/receiving apparatus 100 to packet transmitting/receiving apparatus 300 in exchange will be described.

When a packet with a CID=2 and an SN=50 is transmitted first and a packet with an SN=51 is transmitted next, the latter packet is transmitted with an SN greater by 1 than the SN in an immediately preceding packet. The packet that is to be transmitted can be compressed using UO-0 with the SN size of 4 bits, and so a packet with an SN=51 is compressed and transmitted with a CID=2.

Similarly, when a packet with a CID=2 and an SN=51 is transmitted first and a packet with an SN=52 is transmitted next, the latter packet is transmitted with an SN greater by 1 than the SN in an immediately preceding packet. The packet to be transmitted can be compressed using UO-0 with the SN size of 4 bits, with a CID=2.

Next, when a packet with a CID=2 and an SN=52 is transmitted first and a packet with an SN=3 is transmitted next, the latter packet is transmitted with an SN smaller by 49 than the SN in an immediately preceding packet. UO-0 with the SN size of 4 bits cannot express the change in the SN, and so extended UOR-2 is used for compression.

When a packet with a CID=5 and an SN=3 is transmitted first and a packet with an SN=53 is transmitted next, the latter packet is transmitted with an SN greater by 50 than the SN in an immediately preceding packet. Packet transmitting/ receiving apparatus 100 makes reference to the CID of earlier transmitted packets and transmits a compressed packet. The compressed packet that is to be transmitted has an increase by 1 from a preceding packet with a CID=2 and an SN=52 transmitted with the same CID as that of a packet that is to be transmitted. The increase is expressed using UOR-0.

Thus with the packet transmitting/receiving apparatus according to the present embodiment, the sequence numbers that denote the order of divided packets are compressed per context that identifies data streams, and transmitted at the transmitting end, and the compressed sequence numbers are decompressed per context at the receiving end. By this means data transmission with high compression efficiency is made possible.

The present invention is not limited to the above embodiments and may be implemented with a variety of modifications made thereto. For instance, described with the above embodiments are cases where packet transmission is performed in respect to a packet transmitting/receiving apparatus. However, the packet transmission herein is not limited to these cases and may be performed with respect to software.

One possible way is to first store a program that performs the above packet transmission in ROM (Read Only Memory) and then operate the program using CPU (Central Processor Unit).

Another possible way is to store a program that performs the above packet transmission in a computer-readable memory medium, record this program stored in the memory medium into RAM (Read Access Memory) of a computer, and operate the computer in accordance with the program.

In cases like these, the same functions and effects are possible as in the cases of the above embodiments.

The receiving apparatus and the packet transmitting apparatus that performs wireless communication with the packet receiving apparatus may be applicable to communication terminal apparatuses used in a digital wireless communication system, such as a communication terminal apparatus that performs speech communication and image communication, and a communication relay apparatus that performs speech communication and image communication.

As made clear with the above descriptions, according to the present packet transmitting/receiving apparatus and packet transmission method, at the transmitting end, the sequence numbers that denote the order of divided packets are assigned to a plurality of contexts within a compressible range, and compressed and transmitted on per context basis, and, at the receiving end, the compressed sequence numbers are decompressed on a per context basis. By this means data transmission with high compression efficiency is made possible.

The present invention is not limited to the above described embodiments, and various variations and modifications may be possible without departing from the scope of the present invention.

This application is based on Japanese Patent Application No. 2001-184794 filed on Jun. 19, 2001, the entire contents of which are expressly incorporated by reference herein.

INDUSTRIAL APPLICABILITY

The present invention is suitable for use in respect to a wireless communication apparatus.

What is claimed is:

1. A packet transmitting apparatus, comprising: a context identifier (CID) selection section that sets a plurality of contexts to one data stream; a header compression section that compresses a sequence number on a per context basis, said sequence number denoting the order of packets and said context identifying a data stream; a transmission section that on a per packet basis transmits the sequence number compressed on a per context basis with data; and an sequence number (SN) examination section that compares a sequence number in a packet that is to be transmitted, with a sequence number in an immediately preceding packet, and wherein: said CID selection section, provided that the difference between the sequence number in the packet that is to be transmitted and the sequence number in the immediately preceding packet exceeds a predetermined range, selects a context identifying number that differs from the context identifying number in the immediately preceding packet, and said header compression section compresses a sequence number on a per context identifying number basis.

2. A packet transmitting apparatus, comprising: a context identifier (CID) selection section that sets a plurality of contexts to one data stream; a header compression section that compresses a sequence number on a per context basis, said sequence number denoting the order of packets and said context identifying a data stream; and a transmission section that on a per packet basis transmits the sequence number compressed on a per context basis with data; and an sequence number (SN) examination section that compares a sequence number in a packet that is to be transmitted, with a sequence number in an immediately preceding packet, wherein: said CID selection section, provided that the difference between the sequence number in the packet that is to be transmitted and the sequence number in the immediate preceding packet exceeds a predetermined range, selects a context identifying number that differs from the context identifying number in the immediately preceding packet, said header compression section compresses a sequence number on a per context identifying number basis, and said CID selection section, provided that the sequence number in the packet that is to be transmitted is smaller than the sequence number in the immediately preceding packet, selects a context identifying number that differs from the context identifying number in the immediately preceding packet.

3. A data packet receiving apparatus, comprising:
a reception section that receives on a per data packet basis a sequence number and transmission data, said sequence number denoting the order of data packets,
a context identifier identifying section that extracts a context identifier from said transmission data of said data packet, said context identifier identifying a data stream,
a header decompression section that decompresses a compressed sequence number,
a combination section that reassembles the order of data packets based on sequence numbers, and
an extracting section adapted to extract information on a plurality of context identifiers assigned to said data stream from said data packet, wherein
said combination section is adapted to reassemble the order of data packets using the extracted information on the plurality of context identifiers assigned to said data stream to recover the received data.

4. A computer readable medium having stored therein a computer program having executable instructions for a packet transmission program implemented on a reception apparatus that receives packets using wireless communication, the program comprising the steps of:

receiving a sequence number with data on a per packet basis, said sequence number denoting the order of a packet on a per context basis, separating context based on the context identifying number assigned to the received data, decompressing a compressed sequence number on a per context basis, and combining data by reassembling a packet into the order of a sequence decompressed on a per data stream basis.

5. A packet transmission method dividing data into a plurality of packets and transmitting said packets, the method comprising:

at the transmitting end:

selecting a context identifying number identifying a data stream based on a relationship between a sequence number of a packet that is to be transmitted and a sequence number in an immediately preceding packet;

compressing a sequence number denoting an order of a packet divided on a per context basis; and transmitting transmission data assigned to the context identifying number with the compressed sequence number on a per packet basis; and at the receiving end:

decompressing the compressed sequence number on a per context basis;

separating context based on the context identifying number; and combining data by reassembling a packet into the order of a decompressed sequence number.

* * * * *